(12) United States Patent
Kim et al.

(10) Patent No.: US 12,278,298 B2
(45) Date of Patent: Apr. 15, 2025

(54) SOLAR CELL

(71) Applicant: Trina Solar Co., Ltd., Changzhou (CN)

(72) Inventors: Jeongkyu Kim, Seoul (KR); Sunghyun Hwang, Seoul (KR); Daeyong Lee, Seoul (KR)

(73) Assignee: Trina Solar Co., Ltd., Changzhou (CN)

( * ) Notice: Subject to any disclaimer, the term of this patent is extended or adjusted under 35 U.S.C. 154(b) by 173 days.

(21) Appl. No.: 14/478,935

(22) Filed: Sep. 5, 2014

(65) Prior Publication Data
US 2015/0090323 A1 Apr. 2, 2015

(30) Foreign Application Priority Data
Sep. 27, 2013 (KR) .......................... 10-2013-0115450

(51) Int. Cl.
*H01L 31/0352* (2006.01)
*H01L 31/068* (2012.01)

(52) U.S. Cl.
CPC ...... *H01L 31/03529* (2013.01); *H01L 31/068* (2013.01); *Y02E 10/547* (2013.01)

(58) Field of Classification Search
CPC ............. H01L 31/0248; H01L 31/0256; H01L 31/0684; H01L 31/03529
See application file for complete search history.

(56) References Cited

U.S. PATENT DOCUMENTS

| | | | |
|---|---|---|---|
| 5,759,292 A | 6/1998 | Arimoto et al. | |
| 2004/0112426 A1* | 6/2004 | Hagino | H01L 31/022425 136/261 |
| 2009/0025786 A1* | 1/2009 | Rohatgi | H01L 31/022425 136/256 |
| 2009/0032081 A1* | 2/2009 | Saita | H01L 31/0508 136/244 |
| 2009/0194153 A1* | 8/2009 | Hilali | H01L 31/1836 136/255 |
| 2010/0243024 A1* | 9/2010 | Hashimoto | H01L 31/0201 136/244 |

(Continued)

FOREIGN PATENT DOCUMENTS

| | | |
|---|---|---|
| JP | 2006-73617 A | 3/2006 |
| KR | 10-2012-0012989 A | 2/2012 |

(Continued)

OTHER PUBLICATIONS

Machine translation of KR 2012-0035291; access and printed Jan. 30, 2023 (Year: 2012).*

*Primary Examiner* — Golam Mowla
(74) *Attorney, Agent, or Firm* — Taft Stettinius & Hollister LLP

(57) ABSTRACT

Discussed is a solar cell including a semiconductor substrate comprising a base region, an emitter region having a conductive type opposite to that of the base region, and a back surface field region having the same conductive type as the base region and a higher doping concentration than the base region, and a first electrode and a second electrode respectively connected to the emitter region and the back surface field region, wherein the base region has a specific resistance of 0.3 Ωcm to 2.5 Ωcm.

11 Claims, 6 Drawing Sheets

(56) References Cited

U.S. PATENT DOCUMENTS

| | | | | |
|---|---|---|---|---|
| 2010/0263718 A1* | 10/2010 | Abiko | ............... | H01L 31/0516 |
| | | | | 136/252 |
| 2011/0048492 A1* | 3/2011 | Nishiwaki | ........... | H01L 31/0504 |
| | | | | 136/244 |
| 2011/0056544 A1* | 3/2011 | Ji | ..................... | H01L 31/028 |
| | | | | 136/255 |
| 2011/0265870 A1* | 11/2011 | Park | ............... | H01L 31/022425 |
| | | | | 136/256 |
| 2011/0284074 A1* | 11/2011 | Liu | ................... | H01L 31/0747 |
| | | | | 136/258 |
| 2012/0048353 A1 | 3/2012 | Woo et al. | | |
| 2012/0125420 A1 | 5/2012 | Karakida | | |
| 2012/0152338 A1* | 6/2012 | Ha | ..................... | H01L 31/068 |
| | | | | 257/E31.124 |
| 2012/0174960 A1* | 7/2012 | Hashigami | ........ | H01L 31/02167 |
| | | | | 136/244 |
| 2013/0081691 A1 | 4/2013 | Tsukigata et al. | | |
| 2013/0160840 A1 | 6/2013 | Lee et al. | | |
| 2013/0206222 A1* | 8/2013 | Ha | ..................... | H01L 31/0684 |
| | | | | 136/259 |
| 2013/0228215 A1 | 9/2013 | Ha et al. | | |
| 2016/0049538 A1* | 2/2016 | Cesar | .................... | H01L 31/18 |
| | | | | 136/249 |

FOREIGN PATENT DOCUMENTS

| | | | | | |
|---|---|---|---|---|---|
| KR | 20120035291 | A | * | 4/2012 | |
| KR | 10-2012-0077710 | A | * | 7/2012 | ......... H01L 31/1804 |
| KR | 10-2012-0084104 | A | | 7/2012 | |
| KR | 10-2013-0073346 | A | | 7/2013 | |
| KR | 10-2013-0104309 | A | | 9/2013 | |
| NL | 2010382 | C2 | * | 9/2014 | ......... H01L 31/0516 |

* cited by examiner

SOLAR CELL

CROSS-REFERENCE TO RELATED APPLICATION

This application claims the priority benefit of Korean Patent Application No. 10-2013-0115450, filed on Sep. 27, 2013 in the Korean Intellectual Property Office, the disclosure of which is incorporated herein by reference.

BACKGROUND OF THE INVENTION

1. Field of the Invention

The embodiments of the invention relate to a solar cell, and more particularly, to a solar cell having an improved structure.

2. Description of the Related Art

In recent years, as conventional energy resources such as petroleum and coal are running out, interest in alternative energy resources replacing these energy resources is on the rise. Of these, solar cells are attracting considerable attention as next generation cells which convert solar energy into electrical energy.

Such a solar cell is manufactured by forming various layers and electrodes according to design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

It is an object of the embodiment of the invention to provide a solar cell with improved efficiency.

In accordance with one aspect of the embodiment of the invention, the above and other objects can be accomplished by the provision of a solar cell including a semiconductor substrate including a base region, an emitter region having a conductive type opposite to that of the base region, and a back surface field region having the same conductive type as the base region and a higher doping concentration than the base region, and a first electrode and a second electrode respectively connected to the emitter region and the back surface field region, wherein the base region has a specific resistance of 0.3 Ωcm to 2.5 Ωcm.

The back surface field region may be locally formed corresponding to an area of the semiconductor substrate in which the second electrode is formed.

A ratio of a total area of the back surface field region to a total area of the semiconductor substrate may be 0.1 to 0.5.

The back surface field region may include a portion having a width of 200 μm to 1,000 μm.

The specific resistance of the base region may be 0.3 Ωcm to 1.35 Ωcm.

The specific resistance of the base region may be 0.3 Ωcm to 1.05 Ωcm.

The specific resistance of the base region may be 0.76 Ωcm to 1.35 Ωcm.

The base region and the back surface field region may be n-conductive type.

The emitter region may be disposed on one surface of the semiconductor substrate and the back surface field region may be disposed on the other surface of the semiconductor substrate.

The first electrode may be formed in a predetermined pattern on the one surface of the semiconductor substrate and the second electrode may be formed in a predetermined pattern on the other surface of the semiconductor substrate to form a bi-facial structure of the solar cell.

The second electrode may include a plurality of finger electrodes, and at least one bus bar electrode connecting the plurality of finger electrodes, and the back surface field region may include a first region corresponding to each of the plurality of finger electrodes.

The solar cell may further include at least one of a passivation film and an anti-reflection film formed on the emitter region, wherein the finger electrode passes through at least one of the passivation film and the anti-reflection film and is connected to the emitter region, and the bus bar electrode is formed on at least one of the passivation film and the anti-reflection film.

The solar cell may further include at least one of the passivation film and the anti-reflection film formed on the emitter region. The plurality of finger electrodes and the at least one bus bar electrode may pass through at least one of the passivation film and the anti-reflection film and may be connected to the emitter region. The back surface field region may further include a second region corresponding to the at least one bus bar electrode.

The back surface field region may have a doping concentration of $3\times10^{15}/cm^3$ to $15\times10^{15}/cm^3$.

The back surface field region may have a sheet resistance of 5 to 90 Ω/□.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Figure 1:
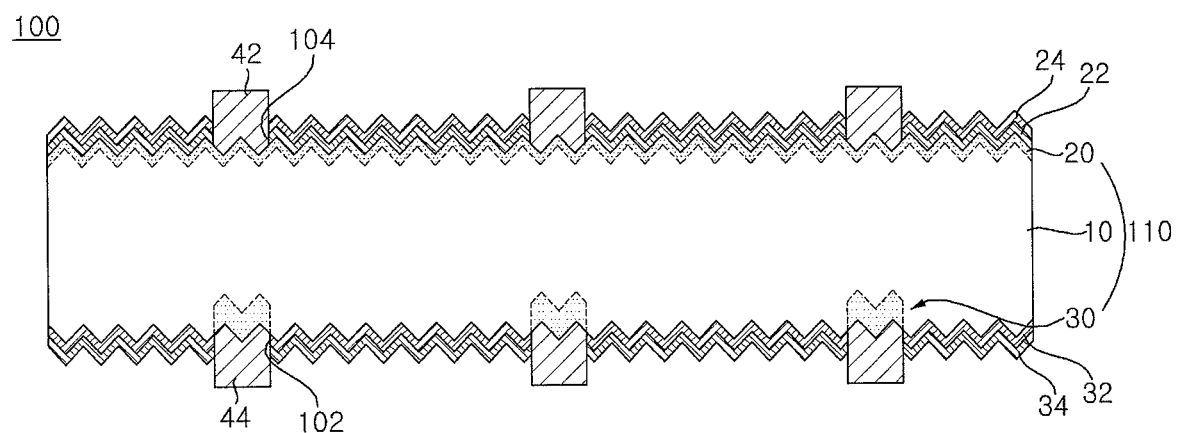
FIG. 1 is a sectional view illustrating a solar cell according to an embodiment of the invention.

Reference will now be made in detail to the embodiments of the invention, examples of which are illustrated in the accompanying drawings. The invention is not limited to the embodiments and the embodiments may be modified into various forms.

In the drawings, parts unrelated to the description are not illustrated for clear and brief description of the embodiments of the invention, and the same reference numbers will be used throughout the specification to refer to the same or considerably similar parts. In the drawings, the thickness or size may be exaggerated or reduced for clearer description.

In addition, the size or area of each constituent element is not limited to that illustrated in the drawings.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell according to an embodiment of the invention will be described in more detail with reference to the annexed drawings.

FIG. 1 is a sectional view illustrating a solar cell according to an embodiment of the invention.

Referring to FIG. 1, the solar cell 100 according to the embodiment includes a semiconductor substrate 110 including a base region 10 and conductive type regions 20 and 30, and electrodes 42 and 44 electrically connected to the base region and/or the conductive type regions 20 and 30. The conductive type regions 20 and 30 may include an emitter region (or a first conductive type region) and a back surface field region 30 (or a second conductive type region) and the electrodes 42 and 44 may include a first electrode 42 electrically connected to the emitter region 20 and a second electrode 44 electrically connected to the back surface field region 30. The solar cell 100 may further include passivation films 22 and 32, an anti-reflective film 24, a capping film 34 and the like. This configuration will be described in more detail.

The semiconductor substrate 110 includes the conductive type regions 20 and 30 and the base region 10 where the conductive type regions 20 and 30 are not disposed. The base region 10 may be composed of silicon (for example, a silicon wafer) including a first conductive type dopant. The base region 10 may be composed of a crystalline semiconductor including a first conductive type dopant. The silicon may be monocrystalline or polycrystalline silicon and the first conductive type dopant may be p- or n-type.

When the base region 10 is p-type, it may include monocrystalline or polycrystalline silicon doped with boron (B), aluminum (Al), gallium (Ga), indium (In) or the like. When the base region 10 is n-type, it may include monocrystalline or polycrystalline silicon doped with phosphorous (P), arsenic (As), bismuth (Bi), antimony (Sb) or the like. The base region may be formed of a variety of materials other than the materials described above.

For example, the base region 10 may include n-type impurities as the first conductive type dopant. As a result, the emitter region 20 forming a pn-junction with the base region 10 is p-type. When light is emitted to the pn junction, electrons produced by photoelectric effect are moved to a second surface (hereinafter, referred to as a "back surface") of the semiconductor substrate 110 and are collected by the second electrode 44, while holes are moved to the front surface of the semiconductor substrate 110 and are collected by the first electrode 42. As a result, electrical energy is generated. Holes having a low drift velocity move to the front surface of the semiconductor substrate 110, rather than the back surface thereof, thereby improving photoelectric conversion efficiency, but the embodiment of the invention is not limited thereto. The base region 10 and the back surface field region 30 may be p-type and the emitter region 20 may be n-type.

The front surface and/or the back surface of the semiconductor substrate 110 are textured so that the surface (or surfaces) has a pyramidal shape or the like with irregularities. When surface roughness is increased due to the irregularities formed on the front surface or the like of the semiconductor substrate 10 by texturing, reflection of light incident upon the front surface or the like of the semiconductor substrate 110 can be reduced. Accordingly, an amount of light reaching the pn junction formed at the boundary between the base region 10 and the emitter region 20 is increased and light loss is thus minimized. However, the embodiment of the invention is not limited to this configuration and irregularities through texturing may not be formed on the front or back surface of the semiconductor substrate 110.

The emitter region 20 having a conductive type opposite to the base region 10 may be formed on the front surface of the semiconductor substrate 110. In the embodiment, when the emitter region 20 is n-type, it may include monocrystalline or polycrystalline silicon doped with phosphorous (P), arsenic (As), bismuth (Bi), antimony (Sb) or the like. When the emitter region 20 is p-type, it may include monocrystalline or polycrystalline silicon doped with aluminum (Al), gallium (Ga), indium (In) or the like.

Figure 3:
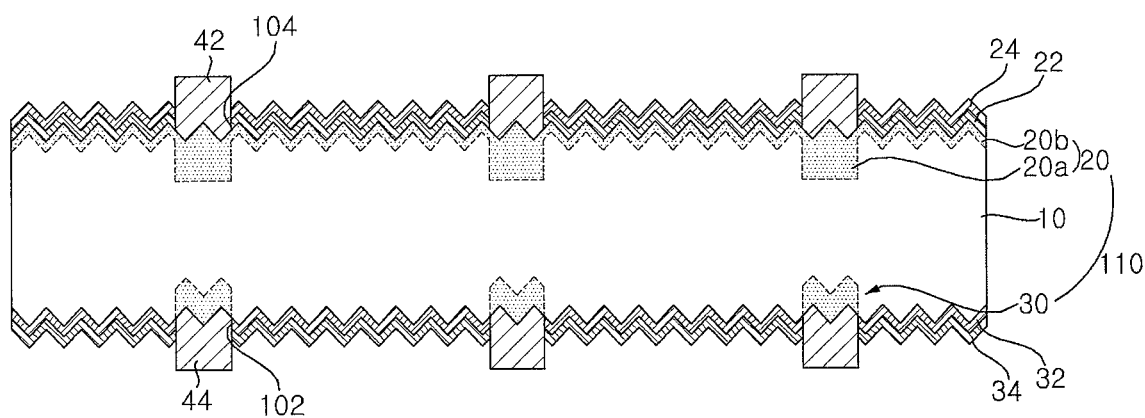
FIG. 3 is a sectional view illustrating a solar cell according to another embodiment of the invention.

Referring to the drawings, the emitter region 20 may have a homogeneous structure with an overall uniform doping concentration, but the embodiment of the invention is not limited thereto. In another embodiment, the emitter region 20 may have a selective structure, as shown in FIG. 3. That is, the emitter region 20 includes a first portion 20a which has a relatively high doping concentration and thus a relatively low resistance and a second portion 20b which has a relatively low doping concentration and thus a relatively high resistance. As a result, the second portion 20b having a relatively high resistance is formed between the first electrodes 24 upon which light is incident, thereby implementing a shallow emitter. As a result, current density of the solar cell 100 can be improved. Furthermore, the first portion 20a having a relatively low resistance is formed adjacent to the first electrode 24, thereby reducing contact resistance with the first electrode 24. When the emitter region 20 has a selective structure, efficiency of the solar cell 100 can be maximized. However, the emitter region 20 may have various structures, as described above.

In the embodiment, the doping region formed by doping a second conductive type dopant on the front surface of the semiconductor substrate 110 constitutes the emitter region 20, but the embodiment of the invention is not limited thereto. The emitter region 20 may have various configurations and is for example formed as a separate layer on the front surface of the semiconductor substrate 110.

The passivation film 22 and the anti-reflection film 24 are disposed in order on the semiconductor substrate 110, more specifically, on the emitter region 20 disposed on the semiconductor substrate 110 and the first electrode 42 is connected (for example, connected by contact) to the emitter region 20 via the passivation film 22 and the anti-reflection film 24.

The passivation film 22 and the anti-reflection film 24 may be substantially formed over the entire surface of the semiconductor substrate 110, excluding a part corresponding to the first electrode 42.

The passivation film 22 contacts the emitter region 20 and passivates defects present on the surface or in the bulk of the emitter region 20. As a result, recombination sites of minority carriers are removed and open-circuit voltage (Voc) of the solar cell 100 is thus increased. The anti-reflection film 24 reduces reflection of light incident upon the front surface of the semiconductor substrate 110. For this reason, it is possible to increase an amount of light which reaches the p-n junction formed at the boundary between the semiconductor substrate 110 and the emitter region 20. Accordingly, open-circuit voltage of the solar cell can be increased. As such, efficiency of the solar cell 100 can be improved by increasing open-circuit voltage and short-circuit current of the solar cell 100 by the anti-reflective film 22 and the anti-reflection film 24.

The passivation film 22 may be formed of a variety of materials. For example, the passivation film 22 may be a single film selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$, or a multilayer film including a combination of two or more of these films. For example, when the emitter region 20 is n-type, the passivation film 22 may include a silicon oxide film, a silicon nitride film or the like, each having a fixed positive charge and when the emitter region 20 is p-type, the passivation film 22 may include an aluminum oxide film having a fixed negative charge or the like.

The anti-reflection film 24 may be formed of a variety of materials. For example, the anti-reflection film 24 may be a single film selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$, or a multilayer film including a combination of two or more of these films. For example, the anti-reflection film 24 may be silicon nitride.

However, the embodiment of the invention is not limited thereto, and the passivation film 22 and the anti-reflection film 24 may include a variety of materials. One of the passivation film 22 and the anti-reflection film 24 may perform both anti-reflection and passivation functions and the other may be thus not provided. In addition, various films other than the passivation film 22 and the anti-reflection film 24 may be formed on the semiconductor substrate 110. Various other modifications are possible.

The first electrode 42 is electrically connected to the emitter region 20 through an opening 104 formed in the passivation film 22 and anti-reflection film 24 (that is, while passing through the passivation film 22 and the anti-reflection film 24). The first electrode 42 may be formed in various shapes using various materials. The shape of the first electrode 42 will be described later with reference to FIG. 4.

A back surface field region 30 having the same first conductivity type as the base region 10 and comprising a first conductivity type impurity in a higher doping concentration than the base region 10 is formed on the back surface of the semiconductor substrate 110. In the embodiment, the back surface field region 30 may include a doping region formed by doping the first conductive type dopant on the back surface of the semiconductor substrate 110.

The back surface field region 30 may have a local structure. That is, the back surface field region 30 may be locally formed in a region where the second electrode 44 is disposed. In addition, an entirety or part of the back surface field region 30 may contact the second electrode 44. The structure or the like of the back surface field region 30 will be described in more detail together with the shape of the second electrode 44, specific resistance of the base region 110 or the like.

The back surface field region 30 functions as a barrier on the second conductive type of minority carriers (for example, a hole when the back surface field region 30 is n-type and an electron when the back surface field region 30 is p-type) on the back surface of the semiconductor substrate 110 to prevent minority carriers from moving to the back surface field region 30 and being recombined on the back surface of the semiconductor substrate 110. In addition, the back surface field region 30 has a relatively low specific resistance due to relatively high doping concentration, thus reducing contact resistance with the second electrode 44.

The passivation film 32 and the capping film 34 are formed in order on the back surface of the semiconductor substrate 110, more specifically, on the back surface field region 30 formed on the semiconductor substrate 110 and the second electrode 44 is connected to the back surface field region 30 via the passivation film 32 and the anti-reflection film 34.

The passivation film 32 and the capping film 34 may be substantially formed over the entire back surface of the semiconductor substrate 110, excluding a part corresponding to the second electrode 44.

The passivation film 32 contacts the back surface field region 30 and passivates defects present on the surface or in the bulk of the back surface field region 30. As a result, recombination sites of minority carriers are removed and open-circuit voltage of the solar cell 100 is thus increased. The capping film 34 prevents contamination of the passivation film 32 or diffusion of undesired matter into the passivation film 32. For example, the capping film 34 prevents a material for forming the second electrode 44 or the like from diffusing into the passivation film 32 in the process of forming the second electrode 44 or the like.

The passivation film 32 may be formed of a variety of materials. For example, the passivation film 32 may be a single film selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$, or a multilayer film including a combination of two or more of these films. For example, when the back surface field region 30 is n-type, the passivation film 32 may include a silicon oxide film or a silicon nitride film, each having a fixed positive charge, or the like and when the back surface field region 30 is p-type, the passivation film 32 may include an aluminum oxide film having a fixed negative charge, or the like.

The capping film 34 may be formed of a variety of materials. For example, the capping film 34 may be a single film selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$, or a multilayer film including a combination of two or more of these films. For example, the capping film 34 may include aluminum oxide, but the embodiment of the invention is not limited thereto, and the passivation film 32 and the capping film 34 may include a variety of materials. In addition, the capping film 34 may be not provided. In addition, various films other than the passivation film 32 and the capping film 34 may be formed on the semiconductor substrate 110. Various other modifications are possible.

The second electrode 44 is electrically connected to the back surface field region 30 through an opening 102 formed in the passivation film 32 and the capping film 34. The second electrode 44 may be formed in various shapes using a variety of materials.

Figure 2:
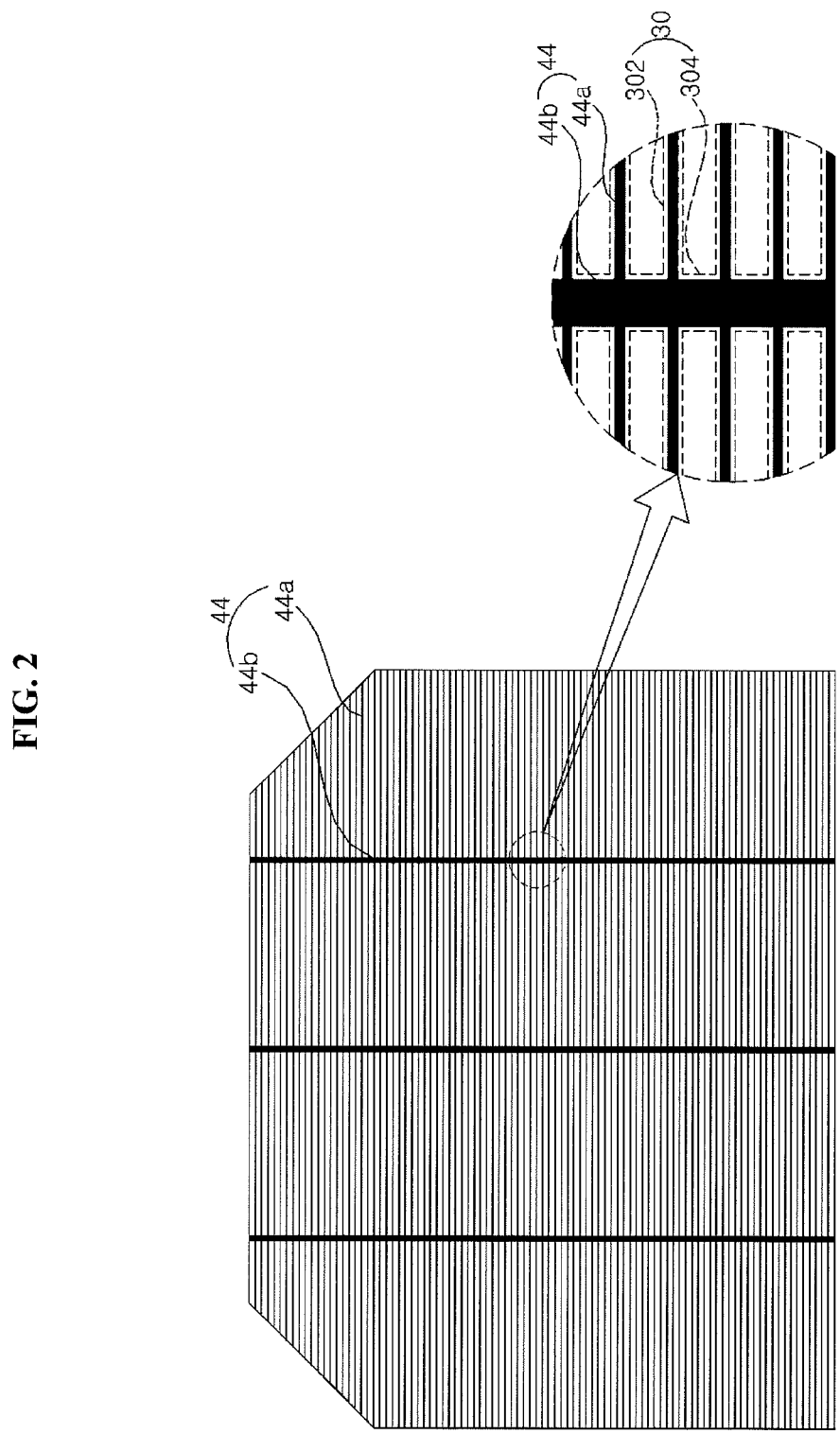
FIG. 2 is a back plan view illustrating the solar cell shown in FIG. 1.

Hereinafter, specific resistance of the base region 110 will be described together with the shape of the second electrode 44 and the shape of the back surface field region 30 with reference to FIGS. 1 and 2. FIG. 2 is a back plan view illustrating the solar cell shown in FIG. 1, which mainly shows the back surface field region 30 and the second electrode 44 disposed on the back surface of the semiconductor substrate 110.

Referring to FIG. 2, the second electrode 44 may include a plurality of finger electrodes 44a having a predetermined pitch and being disposed in parallel to one another. As illustrated in the drawing, the finger electrodes 44a are disposed in parallel to an edge of the semiconductor substrate 110, but the embodiment of the invention is not limited thereto. In addition, the second electrode 44 may include at least one bus bar electrode 44b which is formed in a direction crossing a direction in which the finger electrodes 24a are disposed and connects the finger electrodes 24a. The bus bar electrode 44b may be one in number or a plurality of bus bar electrodes including the bus bar electrode 44b having a pitch larger than that of the finger electrodes 44a may be provided, as shown in FIG. 2. In this case, the width of the bus bar electrode 44b may be greater than that of the finger electrode 44a, but the embodiment of the invention is not limited thereto and the width of the bus bar electrode 44b may be same as or smaller than that of the finger electrode 44a.

Viewing this structure in cross section, both the finger electrode 44a and the bus bar electrode 44b pass through the passivation film 32 and the capping film 34. That is, the opening 102 may be formed corresponding to both the finger electrode 44a and the bus bar electrode 44b of the second electrode 44, but the embodiment of the invention is not limited thereto. In another embodiment, the finger electrode 44a of the second electrode 44 passes through the passivation film 32 and the capping film 34, and the bus bar electrode 44b is formed on the passivation film 32 and the capping film 34 and is connected to the finger electrodes 44a.

In addition, the back surface field region 30 formed corresponding to an area where the second electrode 44 is formed may include a first region 302 formed corresponding to each finger electrode 44a. A plurality of first regions including the first region 302 may be for example disposed in parallel. In addition, the back surface field region 30 may further include a second region 304 formed corresponding to the bus bar electrode 44b. That is, according to embodiments, the back surface field region 30 may include only the first region 302, or both the first region 302 and the second region 304. For example, when both the finger electrode 44a and the bus bar electrode 44b of the second electrode 44 pass through the passivation film 32 and the capping film 34, the back surface field region 30 includes the first and second regions 302 and 304 and is formed in a part of the second electrode 44 contacting the semiconductor substrate 110. In another embodiment, when the finger electrode 44a of the second electrode 44 passes through the passivation film 32 and the capping film 34, and does not pass through the bus bar electrode 44b, the back surface field region 30 includes the first region 302 which is formed in a part of the finger electrodes 44a of the second electrode 44 contacting the semiconductor substrate 110, but the embodiment of the invention is not limited thereto.

In the embodiment, the back surface field region 30 is locally formed in the part corresponding to the second electrode 44 to reduce contact resistance with the second electrode 44 and maintain excellent fill factor (FF) properties. In addition, the back surface field region 30 including the doping region is not formed in the region where the second electrode 44 is not formed, to reduce recombination that may result from formation of the doping region and thereby improve short-circuit current (Jsc) and open-circuit voltage. In addition, in the region where the back surface field region is not formed, internal quantum efficiency (IQE) is excellent and properties associated with light of long wavelengths are considerably excellent. Accordingly, properties associated with light of long wavelengths can be greatly improved, as compared to the homogeneous structure and the selective structure in which the doping region is entirely formed. The back surface field region 30 having a local structure maintains high fill factor, short-circuit current density and open-circuit voltage associated with efficiency of the solar cell 100 and thereby improves efficiency of the solar cell 100.

In the embodiment, a ratio of a total area of the back surface field region 30 to a total area of the semiconductor substrate 110 may be 0.1 to 0.5. When the ratio is less than 0.1, the area of the back surface field region 30 is minimized and alignment error with the second electrode 44 caused by process error may be great. For this reason, contact resistance between the semiconductor substrate 110 and the second electrode 44 is increased and fill factor is greatly deteriorated. When the ratio exceeds 0.5, the area of the doping region, i.e. the back surface field region 30, is increased and short-circuit current density and open-circuit voltage are thus deteriorated.

In addition, the width of the first region 30a is greater than that of the finger electrode 44a so that the finger electrode 44a entirely contacts the back surface field region 30 having a local structure. The reason for this is that a predetermined margin is secured to compensate for alignment error, although the alignment error is present. For example, the width of the first region 30a may be 200 μm to 1,000 μm and the width of the finger electrodes 44a may be 30 μm to 300 μm, but the embodiment of the invention is not limited thereto. The width of the first region 30a and the width of the finger electrodes 44a may be changed.

Although the width of the first region 30a or the like is controlled, the second electrode 44 may be connected (for example, by contact) in the region where the back surface field region 30 is not formed. The alignment errors are generated in various directions including vertical, longitudinal and rotational directions in various apparatuses such that they overlap one another. For this reason, it is difficult to prevent all the alignment errors although a predetermined margin is present. As such, when alignment of the back surface field region 30 and the second electrode 44 is not accurately implemented, the second electrode 44 contacts the base region 10, rather than the back surface field region 30. Accordingly, contact resistance is increased and fill factor is readily degraded. Accordingly, although the back surface field region 30 having the local structure has superior effects, the back surface field region 30 having the local structure may not exert such effects upon practical application. In consideration of this point, in the embodiment, the solar cell 100 using the back surface field region 30 having the local structure has a limited specific resistance of the base region to prevent deterioration in fill factor although the alignment error is present.

The specific resistance of the base region 10 is directly related to fill factor, short-circuit current density and open-circuit voltage. That is, when the specific resistance of the base region 10 is high, lifetime of carriers generated in the base region 10 increases and short-circuit current density thus increases, but contact resistance with the second electrode 44 increases and fill factor is deteriorated. In addition, when the specific resistance of the base region 10 is high, built-in potential may be deteriorated due to difference in work function between the base region 10 and the emitter region 20 caused by low doping concentration and open-circuit voltage may be thus deteriorated. That is, when specific resistance of the base region 10 is high, short-circuit current density is high, and fill factor and open-circuit voltage properties are bad. On the other hand, when specific resistance of the base region 10 is low, short-circuit current density is low, and fill factor and open-circuit voltage properties are good.

As such, the specific resistance of the base region 10 causes a trade-off between short-circuit current density, fill factor and open-circuit voltage. As described above, the back surface field region 30 having the local structure may be greatly deteriorated in fill factor due to alignment. In the embodiment, specific resistance of the base region 10 is kept low as compared to conventional cases and fill factor properties are thus improved. That is, fill factor can be maintained excellent due to specific resistance of the base region 10 although alignment error is generated in the back surface field region 30 having the local structure.

For example, specific resistance of the base region 10 may be 0.3 Ωcm to 2.5 Ωcm. When specific resistance of the base region 10 is less than 0.3 Ωcm, reliability of the solar cell 100 may be deteriorated. More specifically, the semiconductor substrate 110 obtained from a lower part of an ingot for manufacturing the semiconductor substrate 110 (for example, a silicon wafer substrate) should be used so that specific resistance of the base region 10 is adjusted to a level lower than 0.3 Ωcm. However, as various impurities are aggregated in the lower part of the ingot, the semiconductor substrate 110 obtained from the lower part has a bad impurity uniformity and the solar cell 100 manufactured using the same has low efficiency and a deteriorated reliability due to great efficiency difference. In addition, when specific resistance of the base region 10 exceeds 2.5 Ωcm, inaccurate alignment between the second electrode 44 and the back surface field region 30 having the local structure may cause deterioration of contact resistance in an area where the second electrode 44 contacts the base region 10. For this reason, fill factor is degraded and efficiency of the solar cell 100 is deteriorated.

More specifically, specific resistance of the base region 10 may be 1.35 Ωcm or less (that is, 0.3 Ωcm to 1.35 Ωcm). The reason for this is that, when specific resistance of the base region 10 is 1.35 Ωcm or less, fill factor and open-circuit voltage are broadly deteriorated although specific resistance is increased, and when the specific resistance of the base region 10 exceeds 1.35 Ωcm, fill factor and open-circuit voltage are sharply deteriorated with increase in specific resistance. In consideration of this point, specific resistance of the base region 10 is adjusted to a level of 1.35 Ωcm or less, so that better fill factor and open-circuit voltage can be maintained without greatly reducing specific resistance of the base region 10. Specific resistance of the base region 10 may be 0.3 Ωcm to 1.05 Ωcm to maintain better fill factor and open-circuit voltage.

When taking into consideration difficulty in forming the base region 10 having a low specific resistance, the specific resistance of the base region 10 may be 0.76 Ωcm or more (that is, 0.76 Ωcm to 2.5 Ωcm, for example, 0.76 Ωcm to 1.35 Ωcm). The case in which the specific resistance of the base region 10 is 0.76 Ωcm or more provides fill factor and open-circuit voltage comparable to the case in which the specific resistance of the base region 10 is 0.3 Ωcm. Accordingly, the semiconductor substrate 110 is more easily manufactured and reliability of the solar cell 100 is thus improved by slightly increasing specific resistance. Specific resistance of the base region 10 may be 0.76 Ωcm to 1.05 Ωcm so that fill factor and open-circuit voltage can be better maintained.

The base region 10 having the specific resistance range defined above may have better effects when it has an n-conductive type. This will be described in more detail. When the base region 10 is p-type, the back surface field region 30 is formed by diffusing a material (for example, aluminum) contained in the second electrode 44 without additional doping so that great deterioration in short-circuit current density and open-circuit voltage can be prevented. On the other hand, when the base region 10 is n-type, the back surface field region 30 is formed by additional doping such as ion implantation, and short-circuit current density and open-circuit voltage may be greatly deteriorated during this process. Accordingly, when the base region 10 is n-type, the area of the back surface field region 30 should be minimized in consideration of short-circuit current density and open-circuit voltage so as to greatly improve efficiency of the solar cell 100. The decrease in area of the back surface field region 30 may have a negative effect on fill factor. Great effects can be obtained by adjusting specific resistance of the base region 10 to a relatively low level as in the embodiment.

In addition, the base region 10 is applied to a bi-facial solar cell 100 to maximize effects thereof. As described above, the bi-facial solar cell 100 means a solar cell wherein the emitter region 20 is disposed on one surface of the semiconductor substrate 110, the back surface field region 30 is disposed on the other surface of the semiconductor substrate 110, and the first and second electrodes 42 and 44 have a predetermined pattern. A back-contact solar cell having a back contact structure (that is, a solar cell wherein all of the emitter region and the back surface field region, and first and second electrodes connected thereto are disposed on the back surface of the semiconductor substrate) has a lifetime of carriers as an essential factor and thus has a limitation on reduction of specific resistance of the base region 10. The bi-facial solar cell 100 according to the embodiment in which lifetime of carriers is less essential maximizes efficiency of the solar cell 100 by using the base region 10 having a relatively low specific resistance, but the embodiment of the invention is not limited thereto.

In the embodiment, the doping concentration of the back surface field region 30 may be $3\times10^{15}/cm^3$ to $15\times10^{15}/cm^3$. When the doping concentration of the back surface field region 30 is less than $3\times10^{15}/cm^3$, effects of the back surface field region having a local structure cannot be maximized due to difficulty in minimization of contact resistance with the second electrode 44. When the doping concentration of the back surface field region 30 exceeds $15\times10^{15}/cm^3$, open-circuit voltage and short-circuit current density may be deteriorated.

The back surface field region 30 may have a sheet resistance may be 5Ω/□ to 90Ω/□. When the sheet resistance of the back surface field region 30 is less than the range defined above, open-circuit voltage and short-circuit current density may be deteriorated due to high doping concentration. When the sheet resistance of the back surface field region 30 exceeds the range defined above, effects of the back surface field region 30 having the local structure cannot be maximized due to difficulty in minimization of contact resistance with the second electrode 44, but the embodiment of the invention is not limited thereto, and the doping concentration and sheet resistance of the back surface field region 30 may be changed.

As such, in the embodiment, the solar cell 100 having the back surface field region 30 having a local structure can compensate for fill factor by limiting the specific resistance of the base region 10 to a predetermined range. Accordingly, fill factor, short-circuit current density and open-circuit voltage associated with efficiency of the solar cell 100 having the back surface field region 30 having a local structure are improved and efficiency of the solar cell 100 is thus maximized. Such an effect can be maximized in the bi-facial solar cell 100 having an n-type base region 10.

Although not additionally shown, the first electrode 42 may have a similar structure to the second electrode 44. That is, the first electrode 42 may include finger electrodes corresponding to finger electrodes 44a of the second electrode and bus bar electrodes corresponding to the bus bar electrode 44b of the second electrode 44. Viewing this structure in cross section, both the finger electrode and the bus bar electrode of the first electrode 42 may pass through the passivation film 22 and the anti-reflection film 24. That is, the opening 104 may be formed corresponding to the finger electrode and the bus bar electrode of the first electrode 42, but the embodiment of the invention is not limited thereto. In another embodiment, the finger electrode of the first electrode passes through the passivation film 22 and the anti-reflection film 24, and the bus bar electrode is connected to the finger electrode of the first electrode 42 in the passivation film 22 and the anti-reflection film 24. The width, pitch and the like of the finger electrode and the bus bar electrode of the first electrode 42 may be the same as or different from those of the second electrode 44 and the bus bar electrode 44b of the finger electrodes 44a. Other details of the finger electrode and the bus bar electrode of the first electrode 42 are similar to those of the finger electrodes 44a and the bus bar electrode 44b of the second electrode 44 and explanation thereof is thus omitted.

Hereinafter, the embodiment of the invention will be described in more detail based on the following test examples. However, the test examples are only provided to illustrate the embodiment of the invention and should not be construed as limiting the embodiment of the invention.

Example 1

A semiconductor substrate having a specific resistance of 0.3 Ωcm and an n-type base region was prepared. A front surface of the semiconductor substrate was doped with boron (B) by ion implantation to form an emitter region and a back surface of the semiconductor substrate was doped with phosphorous (P) by ion implantation to form a back surface field region. At this time, the back surface field region was locally formed in only the part corresponding to the second electrode.

A passivation film and an anti-reflection film were formed on the front surface of the semiconductor substrate and a passivation film and a capping film were formed on the back surface of the semiconductor substrate. In addition, a first electrode electrically connected to the emitter region and a second electrode electrically connected to the back surface field region were formed, to manufacture a solar cell.

Example 2

A solar cell was manufactured in the same manner as in Example 1, except that specific resistance of the base region was 0.76 Ωcm.

Example 3

A solar cell was manufactured in the same manner as in Example 1, except that specific resistance of the base region was 1.05 Ωcm.

Example 4

A solar cell was manufactured in the same manner as in Example 1, except that specific resistance of the base region was 1.35 Ωcm.

Example 5

A solar cell was manufactured in the same manner as in Example 1, except that specific resistance of the base region was 1.6 Ωcm.

Example 6

A solar cell was manufactured in the same manner as in Example 1, except that specific resistance of the base region was 2.5 Ωcm.

Comparative Example 1

A solar cell was manufactured in the same manner as in Example 1, except that specific resistance of the base region was 3.2 Ωcm.

Comparative Example 2

A solar cell was manufactured in the same manner as in Example 1, except that specific resistance of the base region was 0.1 Ωcm.

Figure 4:
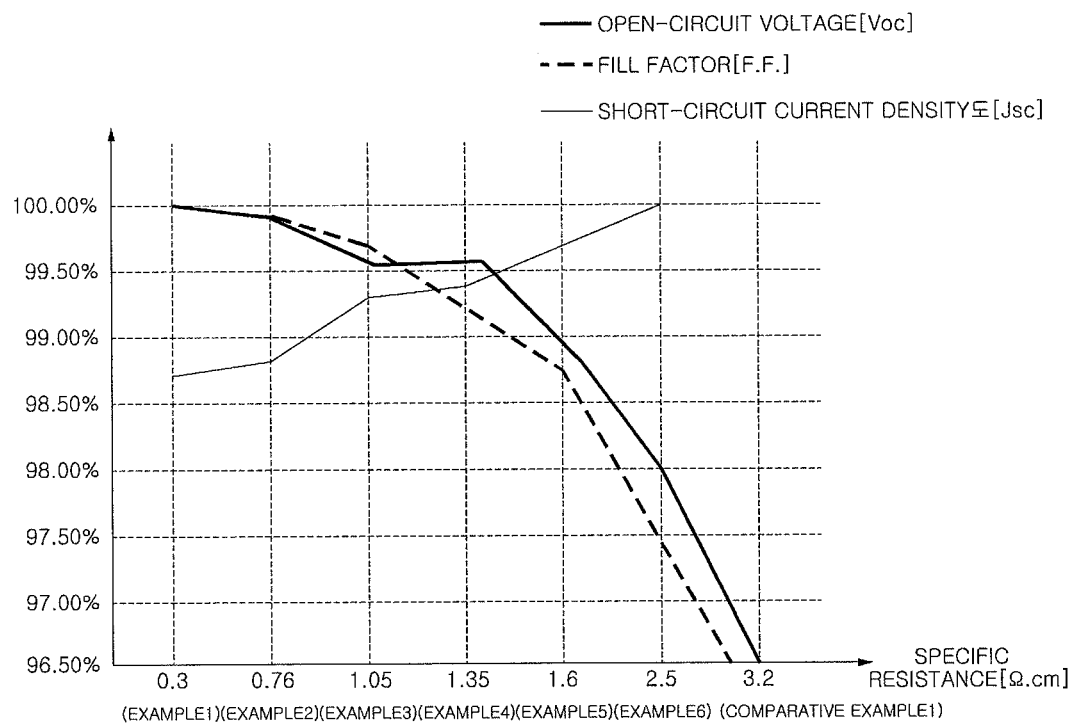
FIG. 4 is a graph showing fill factor, short-circuit current density and open-circuit voltage of solar cells manufactured according to Examples 1 to 6 and Comparative Example 1.
Figure 5:
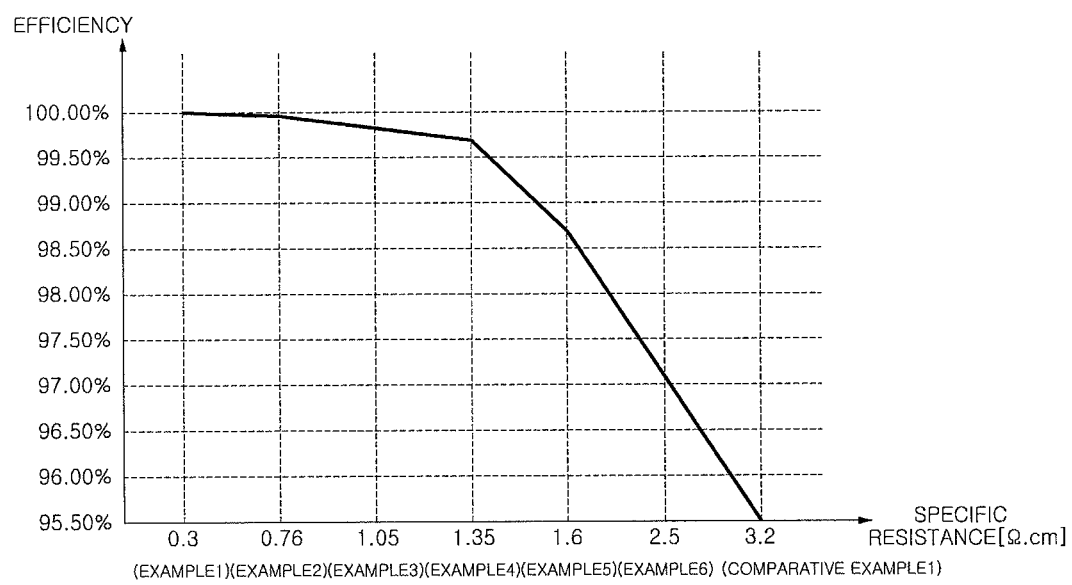
FIG. 5 is a graph showing efficiency of solar cells manufactured according to Examples 1 to 6 and Comparative Example 1.

Measurement results of fill factor, short-circuit current density and open-circuit voltage of solar cells according to Examples 1 to 6, and Comparative Example 1 are shown in FIG. 4 and efficiency thereof is shown in FIG. 5. In FIGS. 4 and 5, the fill factor and open-circuit voltage are represented relative to 100% values of the solar cell manufactured according to Example 1 and the short-circuit current density is represented relative to the 100% value of the solar cell manufactured according to Example 6. The solar cell according to Comparative Example 2 has low reliability and bad properties, thus making it impossible to measure fill factor, short-circuit current density and open-circuit voltage. An efficiency graph of the solar cell according to specific resistance of the base region was obtained by simulation and is shown in FIG. 6.

Referring to FIGS. 4 and 5, as specific resistance of the base region increases, fill factor and open-circuit voltage are deteriorated and short-circuit current density is improved. In Comparative Example 1 using a base region having a high specific resistance, fill factor and short-circuit current density are greatly deteriorated to 98% or less, and efficiency is also degraded to 96.5% or less. Accordingly, in Comparative Example 1 having a specific resistance of the base region higher than 2.5 Ωcm, efficiency of the solar cell is greatly degraded due to deterioration in fill factor and short-circuit current density.

Although specific resistance of the base region is increased, open-circuit voltage and efficiency of the solar cell are greatly decreased in a range greater than a predetermined specific resistance (1.35 Ωcm) of the base region, and are broadly decreased in a range less than the specific resistance. Accordingly, open-circuit voltage properties and efficiency can be greatly improved by setting the specific resistance of the base region to 1.35 Ωcm or less. In addition, although specific resistance of the base region is increased, fill factor of the solar cell is greatly decreased in a range greater than a predetermined specific resistance (1.05 Ωcm) of the base region, and are broadly decreased in a range less than the specific resistance. Accordingly, superior open-circuit voltage and fill factor properties can be maintained and efficiency of the solar cell can thus be more improved by setting the specific resistance of the base region to 1.05 Ωcm or less.

Figure 6:
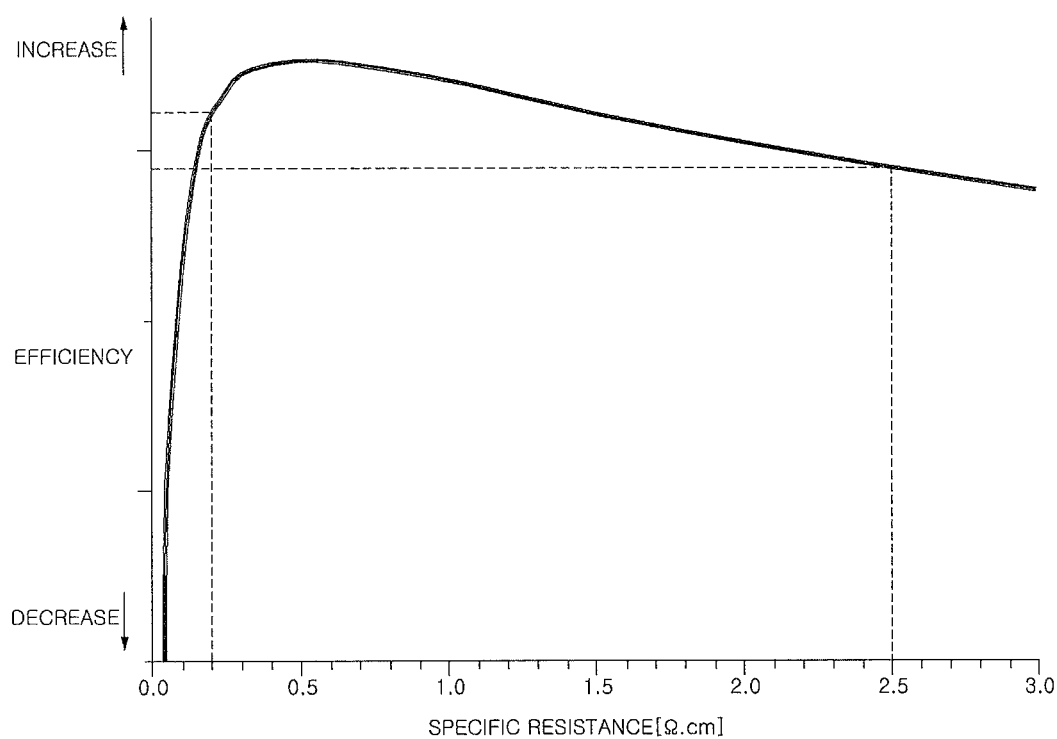
FIG. 6 is a graph showing efficiency of the solar cell according to specific resistance of a base region obtained by simulation.

As can be seen from FIG. 6, efficiency of the solar cell is considerably low in a section in which specific resistance of the base region is lower than 0.3 Ωcm, and efficiency of the solar cell is low in a section in which specific resistance of the base region is higher than 2.5 Ωcm. In addition, efficiency of the solar cell is high in a section in which specific resistance of the base region is 0.3 to 1.35 Ωcm, and efficiency of the solar cell is much higher in a section in which specific resistance of the base region is 0.3 to 1.05 Ωcm.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
a semiconductor substrate having a base region of an n-type;
an emitter region having a p-type, the emitter region being formed on a front surface of the semiconductor substrate;
a plurality of back surface field regions having the n-type and a doping concentration higher than the base region, the plurality of back surface field regions being locally formed on a back surface of the semiconductor substrate and separated from each other so that the base region is located between the plurality of back surface field regions from the back surface of the semiconductor substrate;
a first passivation layer formed on the emitter region;
a plurality of first electrodes connected to the emitter by penetrating through the first passivation layer;
a second passivation layer and a capping film formed in sequence on the back surface of the semiconductor substrate; and
a plurality of second electrodes connected to the plurality of back surface field regions, respectively, by penetrating through the second passivation layer,
wherein the base region has a specific resistance of 0.76 Ωcm or more and less than 1.05 Ωcm,
wherein the plurality of the back surface field regions have a sheet resistance of 5 Ω/sq to 90 Ω/sq,
wherein a ratio of a total area of the plurality of back surface field regions to a total area of the semiconductor substrate is 1:10 to 29:100 or 39:100 to less than 1:2,
wherein the plurality of back surface field regions have a doping concentration of $3\times10^{15}/cm^3$ to $15\times10^{15}/cm^3$,
wherein the plurality of second electrodes includes a plurality of finger electrodes extending in a first direction and least one bus bar electrode extending in a second direction crossing the first direction and connecting the plurality of finger electrodes, and the plurality of finger electrodes are arranged in a stripe shape, and the plurality of back surface field regions are also arranged in a stripe shape,
wherein a width of at least one of the plurality of the back surface field regions is 200 μm to 1,000 μm and a width of at least one of the plurality of second electrodes is 30 μm to 300 μm,
wherein the solar cell has a bi-facial structure that receives light to the back surface of the semiconductor substrate through the second passivation layer and receives light to the front surface of the semiconductor substrate through the first passivation layer,
wherein a separation distance between two adjacent back surface field regions of the plurality of back surface field regions formed spaced apart locally is greater than the width of the at least one of the plurality of back surface field regions, and
wherein the plurality of finger electrodes pass through the second passivation layer, and the plurality of back surface field regions have only a region formed corresponding to the plurality of finger electrodes, and
wherein the capping film is adapted to prevent a material for forming the plurality of second electrodes from diffusing into the second passivation layer in a process of forming the plurality of second electrodes, the capping film includes aluminium oxide, and the second passivation layer includes a silicon nitride film, and the capping film is the outermost film on the back surface of the semiconductor substrate.

2. The solar cell according to claim 1, wherein the plurality of first electrodes are formed in a predetermined pattern on the front surface of the semiconductor substrate and the plurality of second electrodes are formed in a predetermined pattern on the back surface of the semiconductor substrate.

3. The solar cell of claim 1, wherein the second passivation layer is in direct contact with the back surface of the semiconductor substrate, the silicon nitride film having a fixed positive charge based on the plurality of back surface field regions having the n-type.

4. The solar cell of claim 1, wherein the plurality of back surface field regions have an n-type dopant.

5. The solar cell of claim 1, wherein the width of the at least one of the plurality of the back surface field regions is greater than a width of the plurality of second electrodes.

6. The solar cell of claim 1, wherein the width of the plurality of second electrodes is 30 μm to 300 μm.

7. A solar cell comprising:
a semiconductor substrate having a base region of an n-type;
an emitter region having a p-type, the emitter region being formed on a front surface of the semiconductor substrate;
a plurality of back surface field regions having the n-type and a doping concentration higher than the base region, the plurality of back surface field regions being locally formed on a back surface of the semiconductor substrate and separated from each other so that the base region is located between the plurality of back surface field regions from the back surface of the semiconductor substrate;
a first passivation layer formed on the emitter region;
a plurality of first electrodes connected to the emitter by penetrating through the first passivation layer;
a second passivation layer and a capping film formed in sequence on the back surface of the semiconductor substrate; and a plurality of second electrodes connected to the plurality of back surface field regions, respectively, by penetrating through the second passivation layer, wherein the base region has a specific resistance of 0.3 Ωcm or more and less than 2.5 Ωcm, wherein a ratio of a total area of the plurality of back surface field regions to a total area of the semiconductor substrate is 1:10 to 1:2, wherein the plurality of second electrodes includes a plurality of finger electrodes extending in a first direction and least one bus bar electrode extending in a second direction crossing the first direction and connecting the plurality of finger electrodes, wherein the solar cell has a bi-facial structure that receives light to the back surface of the semiconductor substrate through the second passivation layer and receives light to the front surface of the semiconductor substrate through the first passivation layer, wherein the capping film is adapted to prevent a material for forming the plurality of second electrodes from diffusing into the second passivation layer in a process of forming the plurality of second electrodes, the capping film includes aluminium oxide, and the second passivation layer includes a silicon nitride film, and the capping film is the outermost film on the back surface of the semiconductor substrate.

8. The solar cell of claim 7, wherein the second passivation layer is in direct contact with the back surface of the semiconductor substrate, the silicon nitride film having a fixed positive charge based on the plurality of back surface field regions having the n-type.

9. The solar cell of claim 7, wherein the plurality of finger electrodes pass through the second passivation layer, and the plurality of back surface field regions have only a region formed corresponding to the plurality of finger electrodes.

10. The solar cell of claim 7, wherein the ratio of the total area of the plurality of back surface field regions to the total area of the semiconductor substrate is in a range equal to or greater than 1:10 and less than 1:2.

11. A solar cell comprising:
a semiconductor substrate having a base region of an n-type;
an emitter region having a p-type, the emitter region being formed on a front surface of the semiconductor substrate;
a plurality of back surface field regions having the n-type and a doping concentration higher than the base region, the plurality of back surface field regions being locally formed on a back surface of the semiconductor substrate and separated from each other so that the base region is located between the plurality of back surface field regions from the back surface of the semiconductor substrate;
a first passivation layer formed on the emitter region;
a plurality of first electrodes connected to the emitter by penetrating through the first passivation layer;
a second passivation layer and a capping film formed in sequence on the back surface of the semiconductor substrate; and
a plurality of second electrodes connected to the plurality of back surface field regions, respectively, by penetrating through the second passivation layer,
wherein the base region has a specific resistance of 0.76 Ωcm or more and less than 1.05 Ωcm,
wherein the plurality of the back surface field regions have a sheet resistance of 5 Ω/sq to 90 Ω/sq,
wherein a ratio of a total area of the plurality of back surface field regions to a total area of the semiconductor substrate is 1:10 to 29:100 or 39:100 to less than 1:2,
wherein the plurality of back surface field regions have a doping concentration of $3\times10^{15}/cm^3$ to $15\times10^{15}/cm^3$,
wherein the plurality of second electrodes includes a plurality of finger electrodes extending in a first direction and least one bus bar electrode extending in a second direction crossing the first direction and connecting the plurality of finger electrodes, and the plurality of finger electrodes are arranged in a stripe shape, and the plurality of back surface field regions are also arranged in a stripe shape,
wherein a width of at least one of the plurality of the back surface field regions is 200 μm to 1,000 μm and a width of at least one of the plurality of second electrodes is 30 μm to 300 μm,
wherein the solar cell has a bi-facial structure that receives light to the back surface of the semiconductor substrate through the second passivation layer and receives light to the front surface of the semiconductor substrate through the first passivation layer,
wherein a separation distance between two adjacent back surface field regions of the plurality of back surface field regions formed spaced apart locally is greater than the width of the at least one of the plurality of back surface field regions, and
wherein the plurality of finger electrodes pass through the second passivation layer, and the plurality of back surface field regions have only a region formed corresponding to the plurality of finger electrodes, and
wherein the capping film is adapted to prevent a material for forming the plurality of second electrodes from diffusing into the second passivation layer in a process of forming the plurality of second electrodes, the capping film includes aluminium oxide, and the capping film is the outmost film on the back surface of the semiconductor substrate.

* * * * *